US009881542B2

(12) United States Patent
Zhang

(10) Patent No.: US 9,881,542 B2
(45) Date of Patent: Jan. 30, 2018

(54) GATE DRIVER ON ARRAY (GOA) CIRCUIT CELL, DRIVER CIRCUIT AND DISPLAY PANEL

(71) Applicants: Boe Technology Group Co., Ltd., Beijing (CN); Ordos Yuansheng Optoelectronics Co., Ltd., Inner Mongolia (CN)

(72) Inventor: Kai Zhang, Beijing (CN)

(73) Assignees: BOE TECHNOLOGY GROUP CO., LTD., Beijing (CN); Ordos Yuansheng Optoelectronics Co., Ltd., Inner Mongolia (CN)

( * ) Notice: Subject to any disclaimer, the term of this patent is extended or adjusted under 35 U.S.C. 154(b) by 0 days.

(21) Appl. No.: 15/106,491

(22) PCT Filed: Dec. 11, 2015

(86) PCT No.: PCT/CN2015/097114
§ 371 (c)(1),
(2) Date: Jun. 20, 2016

(87) PCT Pub. No.: WO2017/012254
PCT Pub. Date: Jan. 26, 2017

(65) Prior Publication Data
US 2017/0200408 A1  Jul. 13, 2017

(30) Foreign Application Priority Data
Jul. 21, 2015 (CN) .......................... 2015 1 0429251

(51) Int. Cl.
*G09G 3/20* (2006.01)

(52) U.S. Cl.
CPC ... *G09G 3/2092* (2013.01); *G09G 2300/0408* (2013.01); *G09G 2310/0267* (2013.01);
(Continued)

(58) Field of Classification Search
CPC ... G09G 2310/0291; G09G 2310/0283; G09G 3/2092; G09G 3/3266
See application file for complete search history.

(56) References Cited

U.S. PATENT DOCUMENTS 3,662,342 A * 5/1972 Hedin ................ G07C 9/00904
340/286.01
3,836,247 A * 9/1974 Weinert ............... G03B 27/735
355/36
(Continued)

FOREIGN PATENT DOCUMENTS

| CN | 202996250 | 6/2013 |
|---|---|---|
| CN | 103345911 | 10/2013 |

(Continued)

OTHER PUBLICATIONS

Zhang et al., CN Patent CN 202996250 U (application No. CN 201220544793), published Jun. 12, 2013.*
(Continued)

*Primary Examiner* — Patrick Edouard
*Assistant Examiner* — Peijie Shen
(74) *Attorney, Agent, or Firm* — Calfee, Halter & Griswold LLP

(57) ABSTRACT

Disclosed is a GOA circuit cell, comprising a GOA registering module having a shift register unit and a GOA output module having a digital logic circuit. An current-stage excitation pulse, a second additional clock signal, a first clock signal and a second clock signal are provided to the digital logic circuit, such that only during a first half pulse width of the current-stage excitation pulse, a first gate line driving pulse corresponding to a first half cycle of the first clock signal is output at a first current-stage output terminal, and a second gate line driving pulse corresponding to a second half cycle of the second clock signal is output at a second current-stage output terminal. It also discloses a
(Continued)

GOA circuit formed by cascading the GOA circuit cell and a display panel comprising the driver circuit.

13 Claims, 4 Drawing Sheets

(52) U.S. Cl.
CPC ............... *G09G 2310/0283* (2013.01); *G09G 2310/0286* (2013.01); *G09G 2310/0291* (2013.01); *G09G 2310/08* (2013.01)

(56) References Cited

U.S. PATENT DOCUMENTS

| | | | | |
|---|---|---|---|---|
| 4,351,002 | A * | 9/1982 | Decraemer | H04N 5/126 348/540 |
| 4,481,513 | A * | 11/1984 | Mole | G07C 9/00174 235/382 |
| 6,249,458 | B1 * | 6/2001 | Shokouhi | G11C 16/12 326/80 |
| 2008/0303769 | A1 * | 12/2008 | Tobita | G09G 3/3655 345/92 |
| 2009/0278782 | A1 * | 11/2009 | Chen | G09G 3/3677 345/100 |
| 2014/0198023 | A1 | 7/2014 | Hsu | |

FOREIGN PATENT DOCUMENTS

| | | |
|---|---|---|
| CN | 104361875 | 2/2015 |
| CN | 104966480 | 10/2015 |
| WO | 2017/012254 | 1/2017 |

OTHER PUBLICATIONS

Office action from Chinese Application No. 201510429251.6 dated Mar. 24, 2017.
International Search Report and Written Opinion from PCT/CN2015/097114 dated Apr. 20, 2016.

* cited by examiner

US 9,881,542 B2

GATE DRIVER ON ARRAY (GOA) CIRCUIT CELL, DRIVER CIRCUIT AND DISPLAY PANEL

CROSS-REFERENCE TO THE RELATED APPLICATIONS

The present application is the U.S. national phase entry of PCT/CN2015/097114, with an international filling date of Dec. 11, 2015, which claims the benefit to Chinese Patent Application No. 201510429251.6, filed on Jul. 21, 2015, the entire disclosures of which are incorporated herein by reference.

TECHNICAL FIELD

The present disclosure relates to the display technical field and, in particular, to a gate driver on array (GOA) circuit cell. Further, the present disclosure relates to a driver circuit comprising the GOA circuit cell. Furthermore, the present disclosure relates to a display panel comprising the driver circuit.

BACKGROUND

The manufacturing of prior art displays often adopts the design of gate driver on array (GOA), in which the gate switch circuit of a Thin Film Transistor (TFT) is integrated on the array substrate of a display panel. In this way, a bonding area for the gate driver circuit and a peripheral wiring space can be omitted, thus realizing the aesthetic design of a narrow frame for the display panel.

FIG. 1 illustrates a schematic diagram of a conventional GOA circuit, in which only two cascaded GOA circuit cells are shown, and the corresponding terminals in these two GOA cells, except for the current-stage output terminal (OUT_x, x=1, 2, 3, . . . ), are denoted with the same reference signs. In FIG. 1, CK and CKB are clock signals with opposite phase, CN and CNB are complementary direct current (DC) levels for controlling the forward and reverse scanning directions, STV_N−1 and STV_N+1 are respectively input signals for the forward and reverse scanning, STV_N is a generated intermediate scanning signal, and OUT_1 and OUT_2 are gate driving pulses provided for different pixel rows. When CN is a high level and CNB is a low level, the forward scanning is performed, wherein gate driving pulses are sequentially output on OUT_1, OUT_2, . . . OUT_n (n is the number of pixel rows) as excited by STV_N−1 applied to the first-stage GOA cell. On the contrary, when CN is a low level and CNB is a high level, the reverse scanning is performed, wherein gate driving pulses are sequentially output on OUT_n, OUT_n−1, . . . OUT_1 as excited by STV_N+1 applied to the last-stage GOA cell. In this conventional GOA circuit, each row of pixels needs a corresponding GOA circuit cell to generate a gate driving pulse. Thereby, it requires a huge number of GOA circuit cells, such that the GOA circuit occupies a relatively large frame space, which is disadvantageous for further narrowing the display screen frame.

Therefore, an improved GOA circuit arrangement is needed.

SUMMARY

It is an object of the present disclosure to provide a GOA circuit cell capable of outputting gate driving pulses for two rows of pixels, thereby reducing the number of required GOA cells and thus the frame area to be occupied. Further, it is another object of the present disclosure to provide a driver circuit comprising the GOA circuit cell. Moreover, it is a further object of the present disclosure to provide a display panel comprising the driver circuit.

According to a first aspect of the present disclosure, a GOA circuit cell is provided, comprising: a first input terminal for receiving a current-stage excitation pulse; a second input terminal for receiving a first additional clock signal; a third input terminal for receiving a second additional clock signal, the second additional clock signal being an anti-phase version of the first additional clock signal; a fourth input terminal for receiving a first clock signal; a fifth input terminal for receiving a second clock signal, the second clock signal being an anti-phase version of the first clock signal; a first output terminal for outputting a secondary excitation pulse; a first current-stage output terminal for outputting a first gate line driving pulse; a second current-stage output terminal for outputting a second gate line driving pulse; a GOA registering module, having a shift register unit; and a GOA output module, having a digital logic circuit. The current-stage excitation pulse, the first additional clock signal and the first clock signal are synchronized. The width of the current-stage excitation pulse is equal to one cycle of the first additional clock signal, the cycle of the first additional clock signal is two times the cycle of the first clock signal, and both the widths of the first gate line driving pulse and the second gate line driving pulse are equal to a half cycle of the first clock signal. The current-stage excitation pulse and the first additional clock signal are provided to the shift register unit, such that the secondary excitation pulse is output at the first output terminal, the secondary excitation pulse being a delayed version of the current-stage excitation pulse which is shifted by a half cycle of the first additional clock signal. The current-stage excitation pulse, the second additional clock signal, the first clock signal and the second clock signal are provided to the digital logic circuit, such that only during a first half pulse width of the current-stage excitation pulse, the first gate line driving pulse corresponding in timing to a first half cycle of the first clock signal is output at the first current-stage output terminal, and the second gate line driving pulse corresponding in timing to a second half cycle of the second clock signal is output at the second current-stage output terminal.

In one implementation, the digital logic circuit may comprise: an AND gate, with one of its two input terminals provided with the current-stage excitation pulse, and the other input terminal provided with the second additional clock signal; a first NAND gate, with one of its input terminals connected to an output terminal of the AND gate, and the other input terminal provided with the first clock signal; a first NOT gate, with its input terminal connected to an output terminal of the first NAND gate; a second NAND gate, with one of its input terminals connected to an output terminal of the AND gate, and the other input terminal provided with the second clock signal; and a second NOT gate, with its input terminal connected to an output terminal of the second NAND gate. An output signal of the first NOT gate is routed to the first current-stage output terminal as the first gate line driving pulse, and an output signal of the second NOT gate is routed to the second current-stage output terminal as the second gate line driving pulse.

In one implementation, the digital logic circuit may also comprise: a first buffer circuit for buffering the first gate line driving pulse before routing it to the first current-stage output terminal for output; and a second buffer circuit for buffering the second gate line driving pulse before routing it to the second current-stage output terminal for output.

In one implementation, the first buffer circuit may comprise an even number of NOT gates interconnected in series, and the second buffer circuit may comprise an even number of NOT gates interconnected in series.

In one implementation, the shift register unit may comprise: a third NOT gate, with its input terminal provided with the first additional clock signal; a first tristate NOT gate, with its input terminal provided with the current-stage excitation pulse, its first control terminal connected to an input terminal of the third NOT gate, and its second control terminal connected to an output terminal of the third NOT gate; a second tristate NOT gate, with its output terminal connected to an output terminal of the first tristate NOT gate, its first control terminal connected to an output terminal of the third NOT gate, and its second control terminal connected to an input terminal of the third NOT gate; and a fourth NOT gate, with its input terminal connected to an output terminal of the second tristate NOT gate, its output terminal connected to an input terminal of the second tristate NOT gate, and its output signal routed to the first output terminal as the secondary excitation pulse.

In one implementation, the GOA circuit cell may also comprise a scanning direction control module. The scanning direction control module may comprise: a sixth input terminal for receiving a forward-scanning excitation pulse; a seventh input terminal for receiving a reverse-scanning excitation pulse; a first scanning direction control terminal applied with a first DC level; a second scanning direction control terminal applied with a second DC level, the second DC level being complementary to the first DC level; a second output terminal connected to the first input terminal; and an analog switch, which is configured to selectively route one of the forward-scanning excitation pulse and the reverse-scanning excitation pulse to the second output terminal as the current-stage excitation pulse, under the control of the first DC level and the second DC level.

In one implementation, the analog switch may comprise a first transmission gate and a second transmission gate. The forward-scanning excitation pulse is provided to an input terminal of the first transmission gate. The first DC level is applied to a first control terminal of the first transmission gate. The second DC level is applied to a second control terminal of the first transmission gate. An output signal of the first transmission gate is routed to the second output terminal as the current-stage excitation pulse. The reverse-scanning excitation pulse is provided to an input terminal of the second transmission gate. The second DC level is applied to a first control terminal of the second transmission gate. The first DC level is applied to a second control terminal of the second transmission gate. An output signal of the second transmission gate is routed to the second output terminal as the current-stage excitation pulse.

In one implementation, the GOA circuit cell may be manufactured based on a CMOS or NMOS process.

According to a second aspect of the present disclosure, a GOA circuit is provided, comprising at least two cascaded GOA circuit cells as described in the first aspect of the present disclosure. In a case where the GOA circuit cell does not comprise the scanning direction control module, the first output terminal of each GOA circuit cell, except for the last-stage GOA circuit cell, is connected to the first input terminal of a next-stage GOA circuit cell. And in a case where the GOA circuit cell comprises the scanning direction control module, the sixth input terminal of each GOA circuit cell, except for the first-stage GOA circuit cell, is connected to the first output terminal of a previous-stage GOA circuit cell, and the seventh input terminal of each GOA circuit cell, except for the last-stage GOA circuit cell, is connected to the first output terminal of a next-stage GOA circuit cell.

According to a third aspect of the present disclosure, a display panel is provided, comprising a GOA circuit as described in the second aspect of the present disclosure.

The present disclosure is based on the insight of providing a GOA circuit occupying a smaller area than that in the prior art. Two sets of clock signals having different frequencies and the corresponding logic circuits are introduced. The low-frequency clock is used for driving a GOA shift register unit, and the high-frequency clock is used for driving a GOA output circuit, such that a single GOA cell is capable of outputting gate driving pulses for two rows of pixels, thus reducing the number of required GOA circuit cells.

DETAILED DESCRIPTION

In the following, various embodiments of the present disclosure are to be described in detail in conjunction with the accompanying drawings.

Figure 1:
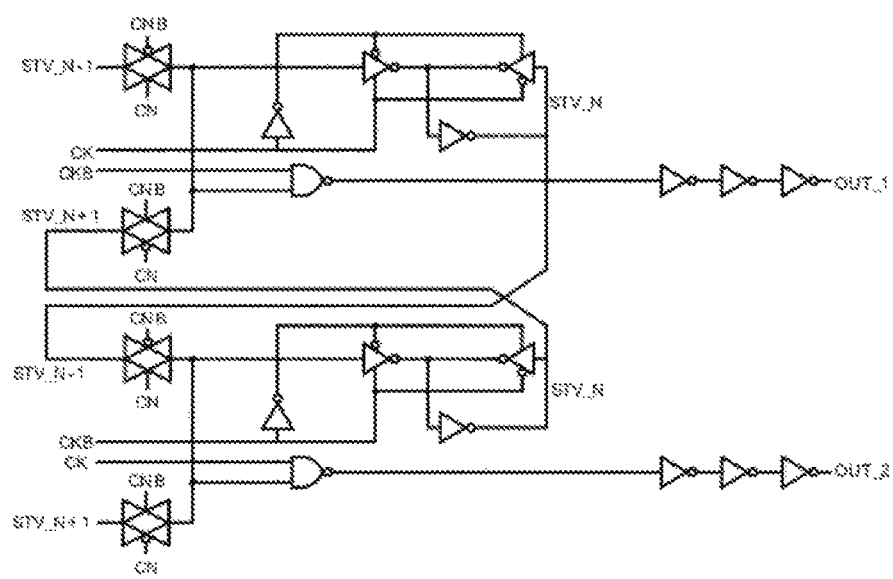
FIG. 1 illustrates a schematic principle diagram of a conventional GOA circuit.
Figure 2:
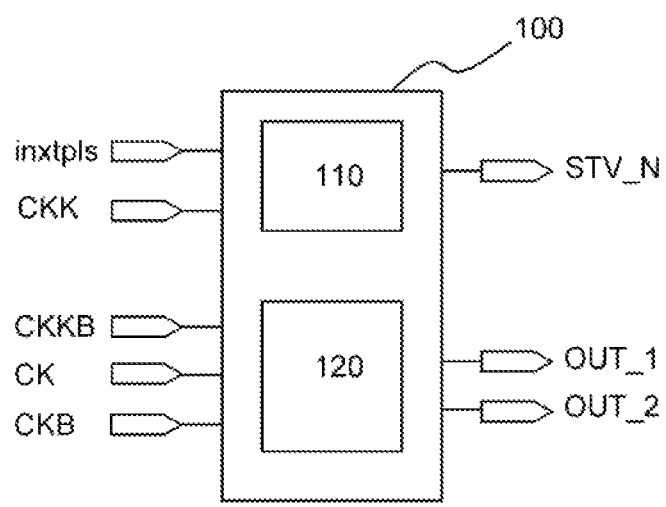
FIG. 2 schematically illustrates a block diagram of a GOA circuit cell according to one embodiment of the present disclosure.

FIG. 2 schematically illustrates a block diagram of a GOA circuit cell 100 according to one embodiment of the present disclosure. The GOA circuit cell 100 works under the driving of an current-stage excitation pulse inxtpls, a first additional clock signal CKK, a second additional clock signal CKKB, a first clock signal CK and a second clock signal CKB. This is similar to the conventional GOA circuit cell as shown in FIG. 1, except that the GOA circuit cell 100 does not have a reverse-scanning function and thus is not provided with a scanning direction control circuit and the corresponding DC control levels CN, CNB. Correspondingly, the GOA circuit cell 100 comprises a first input terminal for receiving the current-stage excitation pulse inxtpls, a second input terminal for receiving the first additional clock signal CKK, a third input terminal for receiving the second additional clock signal CKKB, a fourth input terminal for receiving the first clock signal CK, a fifth input terminal for receiving the second clock signal CKB, a first output terminal for outputting a secondary excitation pulse STV_N, a first current-stage output terminal for outputting a first gate line driving pulse OUT_1, a second current-stage output terminal for outputting a second gate line driving pulse OUT_2, a GOA registering module 110 and a GOA output module 120. The second additional clock signal CKKB is an anti-phase version of the first additional clock signal CKK, and the second clock signal CKB is an anti-phase version of the first clock signal CK.

Figure 3:
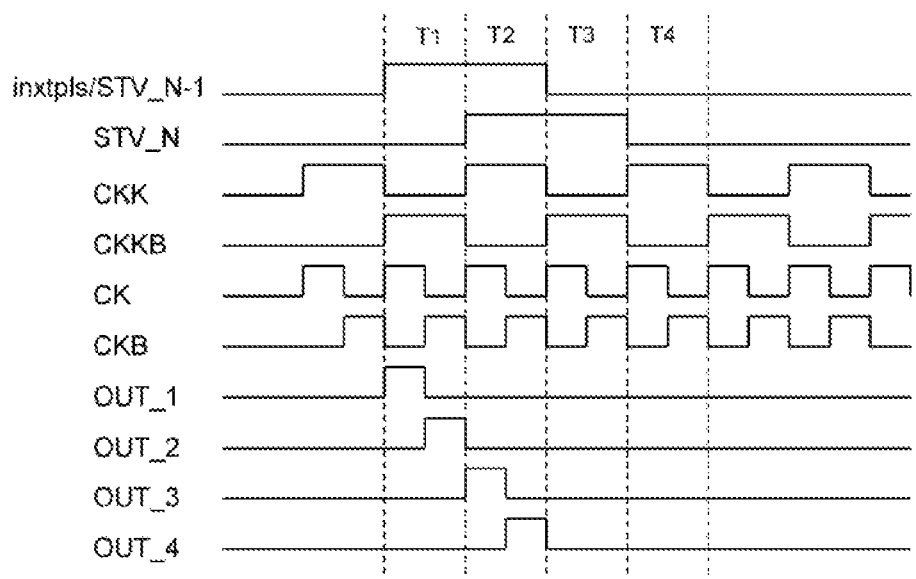
FIG. 3 shows a timing diagram for the GOA circuit cell according to an embodiment of the present disclosure.

In the following, operation of the GOA circuit cell 100 in FIG. 2 is to be introduced in detail in conjunction with the signal timing diagram shown in FIG. 3. FIG. 3 shows a timing diagram for the GOA circuit cell 100 according to an embodiment of the present disclosure. As described above, according to an embodiment of the present disclosure, two sets of clock signals CKK/CKKB and CK/CKB having different frequencies are introduced. The frequency of CKK/CKKB is one half of the frequency of CK/CKB. In other words, the cycle of CKK/CKKB is two times the cycle of CK/CKB. In addition, the current-stage excitation pulse inxtpls, the additional clock signals CKK/CKKB and the clock signals CK/CKB are synchronized, the width of the current-stage excitation pulse inxtpls is equal to one cycle of the first additional clock signal CKK, and both the widths of the first gate line driving pulse OUT_1 and the second gate line driving pulse OUT_2 are equal to a half cycle of the first clock signal CK. Based on such an input-output timing relation, the function, structure and data stream of the GOA circuit cell 100 can be described with hardware description language (HDL). Then, using electronic design automation (EDA) tools, it can be transformed into module combinations of an actual circuit represented by a gate level circuit netlist. Subsequently, the netlist can be transformed into a concrete circuit structure using application specific integrated circuit (ASIC) or field programmable gate array (FPGA) automatic placement and routing tools.

Specifically, the GOA circuit cell 100 may comprise a GOA registering module 110 and a GOA output module 120. The GOA registering module 110 may have a shift register unit. The current-stage excitation pulse inxtpls and the first additional clock signal CKK are provided to the shift register unit, such that a secondary excitation pulse STV_N is output at the first output terminal. The secondary excitation pulse STV_N is a delayed version of the current-stage excitation pulse inxtpls, which is shifted by a half cycle of the first additional clock signal CKK. The GOA output module 120 may have a digital logic circuit. The current-stage excitation pulse inxtpls, the second additional clock signal CKKB, the first clock signal CK and the second clock signal CKB are provided to the digital logic circuit, such that only during a first half pulse width of the current-stage excitation pulse inxtpls, a first gate line driving pulse OUT_1 is output at the first current-stage output terminal and a second gate line driving pulse OUT_2 is output at the second current-stage output terminal. The first gate line driving pulse OUT_1 is corresponding in timing to a first half cycle of the first clock signal CK, and the second gate line driving pulse OUT_2 is corresponding in timing to a second half cycle of the second clock signal CKB.

In this way, with one GOA circuit cell 100, it is possible to provide gate driving pulses OUT_1 and OUT_2 for adjacent two pixel rows.

Figure 4:
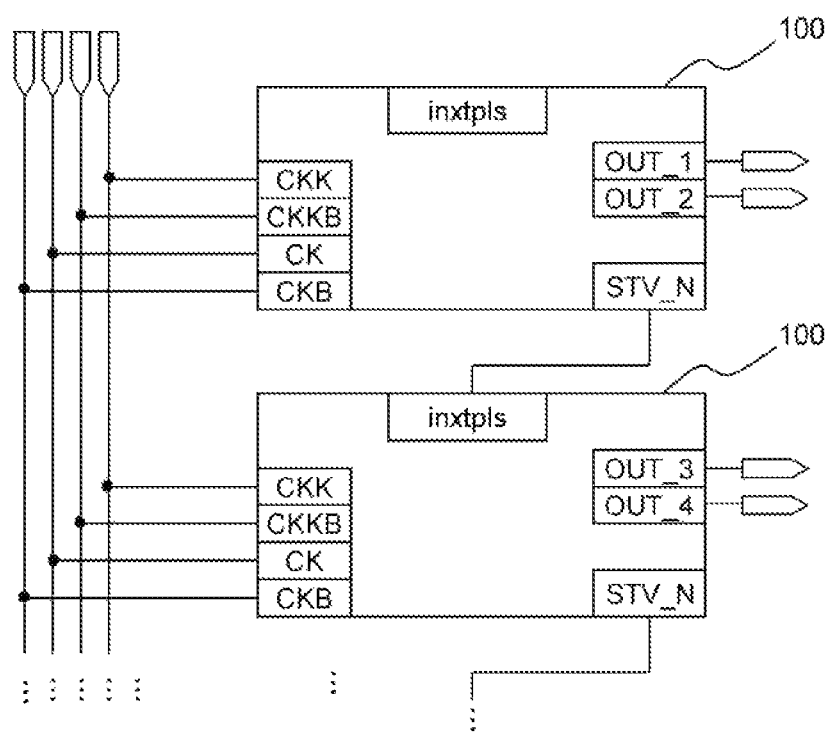
FIG. 4 schematically illustrates a GOA circuit formed by cascading the GOA circuit cell as shown in FIG. 2.

FIG. 4 schematically illustrates a GOA circuit formed by cascading the GOA circuit cell 100 as shown in FIG. 2, in which only two GOA circuit cells 100 are shown, and the corresponding terminals in these two GOA cells 100, except for the current-stage output terminal (OUT_x, x=1, 2, 3, . . . n), are denoted with the same reference signs. As shown, the first output terminal (which outputs a secondary excitation pulse STV_N) of a first-stage GOA circuit cell 100 is connected to the first input terminal (which receives STV_N from the first stage as an current-stage excitation pulse inxtpls) of a second-stage GOA circuit cell 100, and so on. In other words, the first output terminal of each GOA circuit cell 100, except for the last-stage GOA circuit cell 100, is connected to the first input terminal of a next-stage GOA circuit cell. Hereby, under the excitation of the current-stage excitation pulse inxtpls applied to the first-stage GOA circuit cell 100, it is possible to provide corresponding gate driving pulses OUT_1, OUT_2, OUT_3, OUT_4, . . . , OUT_n sequentially to each pixel row.

Figure 5:
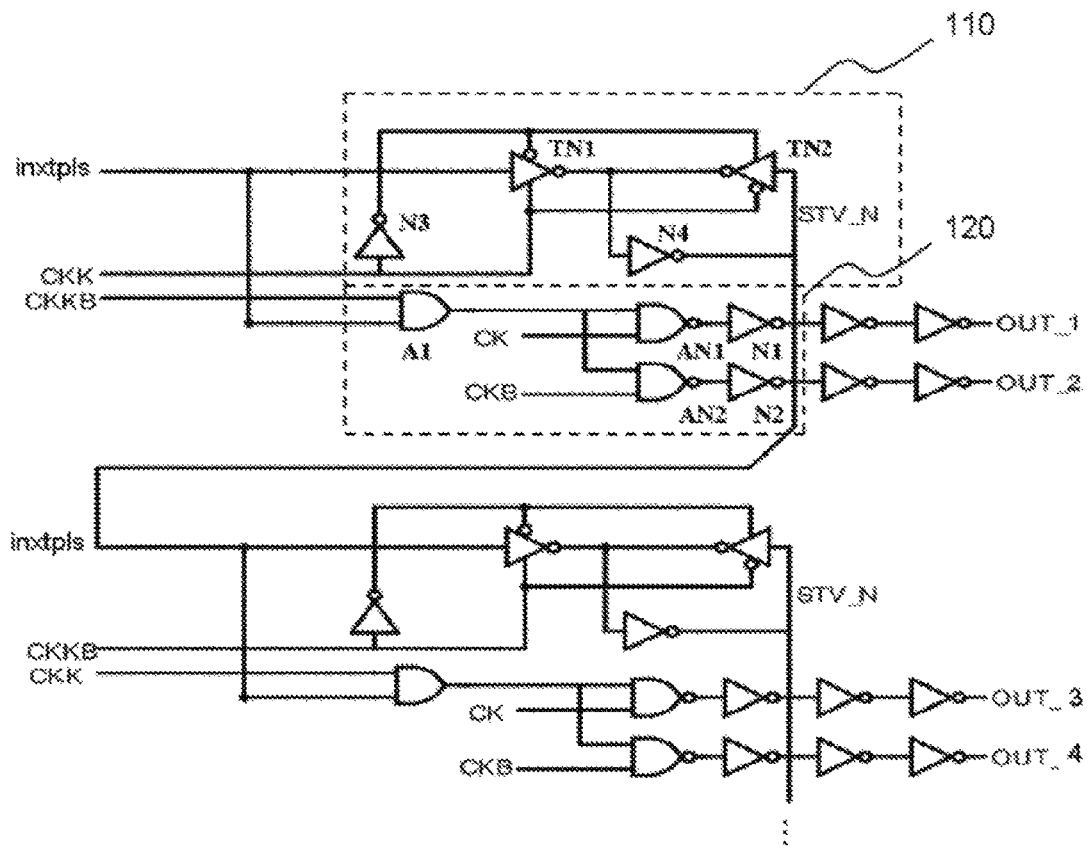
FIG. 5 illustrates a schematic principle diagram for an implementation of a GOA circuit according to an embodiment of the present disclosure.

FIG. 5 illustrates a schematic diagram for an implementation of a GOA circuit according to an embodiment of the present disclosure, in which only two cascaded GOA circuit cells are shown. As shown in FIG. 5, a GOA circuit cell comprises a GOA registering module 110 and a GOA output module 120.

The GOA output module 120 comprises a digital logic circuit for generating two gate driving pulses according to the timing relation as described above with reference to FIG. 3. In this implementation, the digital logic circuit comprises an AND gate A1, a first NAND gate AN1, a first NOT gate N1, a second NAND gate AN2 and a second NOT gate N2. One of the two input terminals of the AND gate A1 is provided with an current-stage excitation pulse inxtpls, and the other is provided with a second additional clock signal CKKB. One input terminal of the first NAND gate AN1 is connected to an output terminal of the AND gate A1, and the other input terminal is provided with a first clock signal CK. An input terminal of the first NOT gate N1 is connected to an output terminal of the first NAND gate AN1. One input terminal of the second NAND gate AN2 is connected to an output terminal of the AND gate A1, and the other input terminal is provided with a second clock signal CKB. An input terminal of the second NOT gate N2 is connected to an output terminal of the second NAND gate AN2. An output signal of the first NOT gate N1 may be routed to a first current-stage output terminal as a first gate line driving pulse OUT_1, and an output signal of the second NOT gate N2 may be routed to a second current-stage output terminal as a second gate line driving pulse OUT_2. In order to improve driving capability of the gate line driving pulses, the digital logic circuit may further comprise a first buffer circuit for buffering the first gate line driving pulse before routing it to the first current-stage output terminal for output, as well as a second buffer circuit for buffering the second gate line driving pulse before routing it to the second current-stage output terminal for output. In this implementation, the first buffer circuit comprises an even number of NOT gates interconnected in series, and the second buffer circuit comprises an even number of NOT gates interconnected in series.

The GOA registering module 110 comprises a shift register unit for generating a secondary excitation pulse according to the timing relation as described above with reference to FIG. 3. In this implementation, the shift register unit comprises a third NOT gate N3, a first tristate NOT gate TN1, a second tristate NOT gate TN2 and a fourth NOT gate N4. An input terminal of the third NOT gate N3 is provided with a first additional clock signal CKK. An input terminal of the first tristate NOT gate TN1 is provided with an current-stage excitation pulse inxtpls, its first control terminal is connected to an input terminal of the third NOT gate N3, and its second control terminal is connected to an output terminal of the third NOT gate N3. An output terminal of the second tristate NOT gate TN2 is connected to an output terminal of the first tristate NOT gate TN1, its first control terminal is connected to an output terminal of the third NOT gate N3, and its second control terminal is connected to an input terminal of the third NOT gate N3. An input terminal of the fourth NOT gate N4 is connected to an output terminal of the second tristate NOT gate TN2, its output terminal is connected to an input terminal of the second tristate NOT gate TN2, and its output signal is routed to a first output terminal of the GOA registering module 110 as the secondary excitation pulse STV_N.

In the following, operation of the GOA circuit in FIG. 5 is to be introduced in detail in conjunction with the signal timing shown in FIG. 3.

During the time period T1, CKK is a low level, CKKB is a high level, and inxtpls is a high level. The first tristate NOT gate TN1 of the shift register unit is switched off, such that inxtpls cannot enter the bistable circuit constituted by the second tristate NOT gate TN2 and the fourth NOT gate N4, but instead is input directly to the AND gate A1 together with CKKB. Then, the output of the AND gate A1 is a high level, which is input respectively to one input terminal of each of the two NAND gates AN1, AN2. While the other input terminals of the two NAND gates AN1, AN2 are provided with CK and CKB respectively. During a first half cycle of CK, CK is a high level and CKB is a low level, such that OUT_1 is high and OUT_2 is low. On the contrary, during a second half cycle of CK, CK is a low level and CKB is a high level, such that OUT_1 is low and OUT_2 is high.

During the time period T2, inxtpls remains at a high level, CKK is a high level, and CKKB is a low level. The first tristate NOT gate TN1 of the shift register unit is switched on, and the second tristate NOT gate TN2 is switched off, such that the bistable circuit does not work. A second half cycle of the pulse inxtpls is routed, through the first tristate NOT gate TN1 and the fourth NOT gate N4, to the first output terminal, outputting a high level signal to be input to a next-stage GOA cell (i.e., a first half cycle of the pulse STV_N, which enables the next-stage GOA cell to generate two gate driving pulses OUT_3/OUT_4). Then, since CKKB is low, the output of the AND gate A1 is a low level, such that no matter whether CK/CKB is a high level, OUT_1/OUT_2 remains to be a low level.

During the time period T3, inxtpls turns into a low level, CKK is a low level, and CKKB is a high level. The first tristate NOT gate TN1 of the shift register unit is switched off, and the bistable circuit works, latching in the high level at a previous time as a second half cycle of the pulse STV_N. Then, as in the time period T2, no matter what state the CK/CKB signal is in, OUT_1/OUT_2 is low.

During the time period T4, inxtpls is still a low level, CKK is a high level, and CKKB is a low level. The first tristate NOT gate TN1 of the shift register unit is switched on, and the second tristate NOT gate TN2 is switched off, such that the bistable circuit does not work. The low level signal inxtpls pulls down the STV_N to a low level through the first tristate NOT gate TN1 and the fourth NOT gate N4. Then, no matter what state the CK/CKB signal is in, the OUT_1/OUT_2 output remains to be a low level.

Thereafter, STV_N and OUT_1/OUT_2 remains at a low level. Each stage of GOA completes shift of the scanning excitation pulse and output of the current-stage driving pulse according to the above process.

Figure 6:
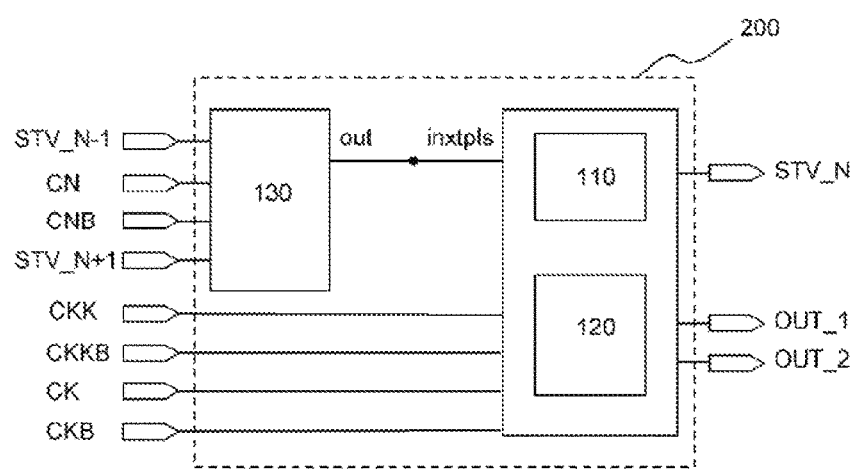
FIG. 6 schematically illustrates a block diagram of a GOA circuit cell according to another embodiment of the present disclosure.

FIG. 6 schematically illustrates a block diagram of a GOA circuit cell 200 according to another embodiment of the present disclosure. As compared with the GOA circuit cell 100 shown in FIG. 2, besides the GOA registering module 110 and the GOA output module 120, the GOA circuit cell 200 may also comprise a scanning direction control module 130. The scanning direction control module 130 comprises a sixth input terminal for receiving a forward-scanning excitation pulse STV_N−1, a seventh input terminal for receiving a reverse-scanning excitation pulse STV_N+1, a first scanning direction control terminal applied with a first DC level CN, a second scanning direction control terminal applied with a second DC level CNB, a second output terminal connected to the first input terminal, as well as an analog switch. The second DC level CNB is complementary to the first DC level CN. The analog switch selectively routes one of the forward-scanning excitation pulse STV_N−1 and the reverse-scanning excitation pulse STV_N+1 to the second output terminal as the current-stage excitation pulse inxtpls, under the control of the first DC level CN and the second DC level CNB. For example, when CN is a high level and CNB is a low level, the analog switch routes the forward-scanning excitation pulse STV_N−1 to the second output terminal as the current-stage excitation pulse inxtpls, and a forward scanning is performed. On the contrary, when CN is a low level and CNB is a high level, the analog switch routes the reverse-scanning excitation pulse STV_N+1 to the second output terminal as the current-stage excitation pulse inxtpls, and a reverse scanning is performed.

Figure 7:
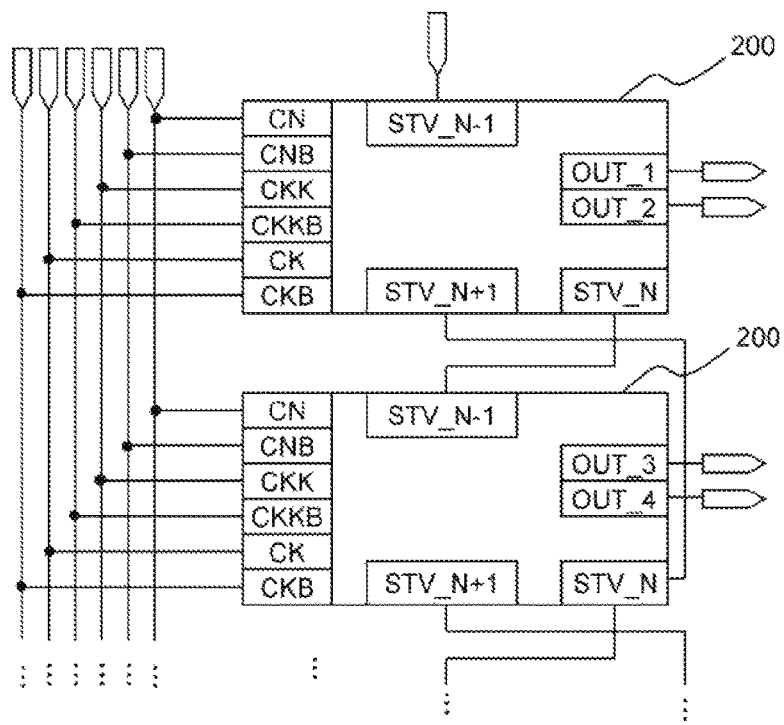
FIG. 7 schematically illustrates a GOA circuit formed by cascading the GOA circuit cell 200 as shown in FIG. 5.

FIG. 7 schematically illustrates a GOA circuit formed by cascading the GOA circuit cell 200 as shown in FIG. 6, in which only two GOA circuit cells 200 are shown, and the corresponding terminals in these two GOA cells 200, except for the current-stage output terminal (OUT_x, x=1, 2, 3, . . . n), are denoted with the same reference signs. As shown, the first output terminal (which outputs a secondary excitation pulse STV_N in the case of a forward scanning) of a first-stage GOA circuit cell 200 is connected to the sixth input terminal (which receives STV_N from the first stage as an current-stage excitation pulse inxtpls in the case of a forward scanning) of a second-stage GOA circuit cell 200, and the first output terminal (which outputs a secondary excitation pulse STV_N in the case of a reverse scanning) of the second-stage GOA circuit cell 200 is connected to the seventh input terminal (which receives STV_N from the second stage as an current-stage excitation pulse inxtpls in the case of a reverse scanning) of the first-stage GOA circuit cell 200, and so on. In other words, the sixth input terminal of each GOA circuit cell, except for the first-stage GOA circuit cell, is connected to the first output terminal of a previous-stage GOA circuit cell, and the seventh input terminal of each GOA circuit cell, except for the last-stage GOA circuit cell, is connected to the first output terminal of a next-stage GOA circuit cell. Hereby, in the case of a forward scanning, as excited by the forward-scanning excitation pulse STV_N−1 applied to the first-stage GOA circuit cell 200, it is possible to provide to each pixel row, from the top down, the corresponding gate driving pulses OUT_1, OUT_2, OUT_3, OUT_4, . . . , OUT_n sequentially. On the contrary, in the case of a reverse scanning, as excited by the reverse-scanning excitation pulse STV_N+1 applied to the last-stage GOA circuit cell 200, it is possible to provide to each pixel row, from the bottom up, the corresponding gate driving pulses OUT_n, OUT_n−1, OUT_n−2, OUT_n−3, . . . , OUT_1 sequentially.

Figure 8:
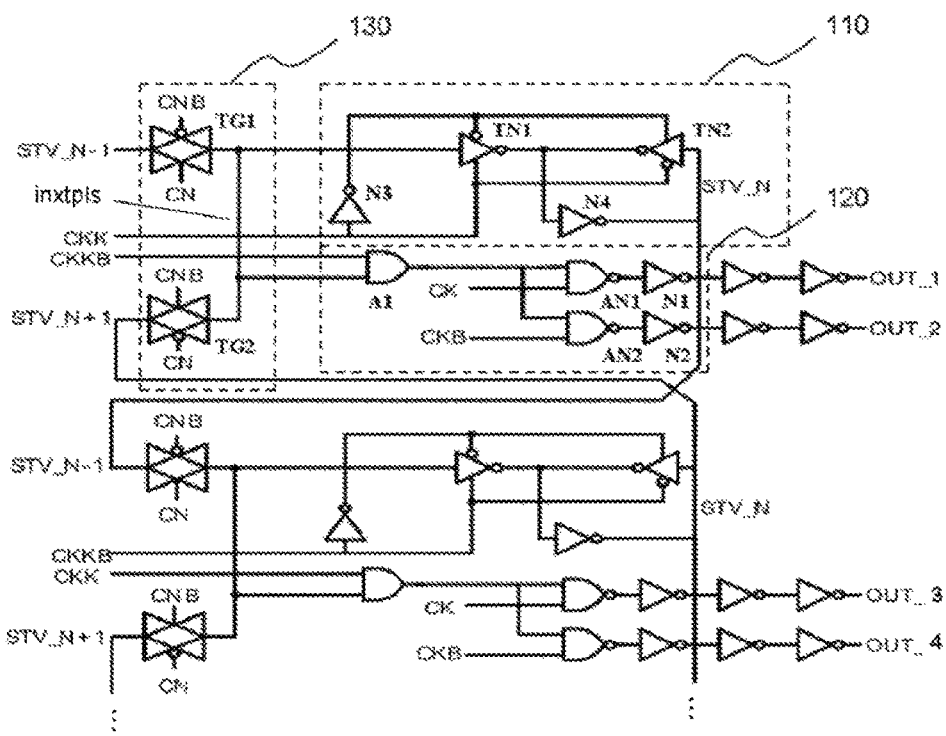
FIG. 8 illustrates a schematic principle diagram for an implementation of a GOA circuit according to another embodiment of the present disclosure.

FIG. 8 illustrates a schematic diagram for an implementation of a GOA circuit according to another embodiment of the present disclosure, in which only two cascaded GOA circuit cells are shown. As shown, a GOA circuit cell comprises a GOA registering module 110, a GOA output module 120 and an optional scanning direction control module 130.

The GOA registering module 110 and the GOA output module 120 shown in FIG. 8 are the same as those described above, and they will not be described in detail here.

Particularly, the optional scanning direction control module 130 comprises an analog switch, which selectively routes one of the forward-scanning excitation pulse STV_N−1 and the reverse-scanning excitation pulse STV_N+1 to the second output terminal, under the control of the first DC level CN and the second DC level CNB. In this implementation, the analog switch comprises a first transmission gate TG1 and a second transmission gate TG2. The forward-scanning excitation pulse STV_N−1 is provided to an input terminal of the first transmission gate TG1, the first DC level CN is applied to a first control terminal of the first transmission gate TG1, and the second DC level CNB is applied to a second control terminal of the first transmission gate TG1. An output signal of the first transmission gate TG1 is routed to the second output terminal of the scanning direction control module 130 as the current-stage excitation pulse inxtpls. The reverse-scanning excitation pulse STV_N+1 is provided to an input terminal of the second transmission gate TG2, the second DC level CNB is applied to a first control terminal of the second transmission gate TG2, and the first DC level CN is applied to a second control terminal of the second transmission gate TG2. An output signal of the second transmission gate TG2 is routed to the second output terminal of the scanning direction control module 130 as the current-stage excitation pulse inxtpls.

In the following, operation of the GOA circuit in FIG. 8 is to be introduced in detail in conjunction with the signal timing shown in FIG. 3. It is assumed that the first DC level CN is a high level, and the second DC level is a low level, i.e., the GOA circuit works in a forward-scanning mode.

During the time period T1, CKK is a low level, CKKB is a high level, and STV_N−1 is a high level. The first tristate NOT gate TN1 of the shift register unit is switched off, such that STV_N−1 cannot enter the bistable circuit constituted by the second tristate NOT gate TN2 and the fourth NOT gate N4, but instead is input directly to the AND gate A1 together with CKKB. Then, the output of the AND gate A1 is a high level, which is input respectively to one input terminal of each of the two NAND gates AN1, AN2. While the other input terminals of the two NAND gates AN1, AN2 are provided with CK and CKB respectively. During a first half cycle of CK, CK is a high level and CKB is a low level, such that OUT_1 is high and OUT_2 is low. On the contrary, during a second half cycle of CK, CK is a low level and CKB is a high level, such that OUT_1 is low and OUT_2 is high.

During the time period T2, STV_N−1 remains at a high level, CKK is a high level, and CKKB is a low level. The first tristate NOT gate TN1 of the shift register unit is switched on, and the second tristate NOT gate TN2 is switched off, such that the bistable circuit does not work. A second half cycle of the pulse STV_N−1 is routed, through the first tristate NOT gate TN1 and the fourth NOT gate N4, to the first output terminal, outputting a high level signal to be input to a next-stage GOA cell (i.e., a first half cycle of the pulse STV_N, which enables the next-stage GOA cell to generate two gate driving pulses OUT_3/OUT_4). Then, since CKKB is low, the output of the AND gate A1 is a low level, such that no matter whether CK/CKB is a high level, OUT_1/OUT_2 remains to be a low level.

During the time period T3, STV_N−1 turns into a low level, CKK is a low level, and CKKB is a high level. The first tristate NOT gate TN1 of the shift register unit is switched off, and the bistable circuit works, latching in the high level at a previous time as a second half cycle of the pulse STV_N. Then, as in the time period T2, no matter what state the CK/CKB signal is in, OUT_1/OUT_2 is low.

During the time period T4, STV_N−1 is still a low level, CKK is a high level, and CKKB is a low level. The first tristate NOT gate TN1 of the shift register unit is switched on, and the second tristate NOT gate TN2 is switched off, such that the bistable circuit does not work. The low level signal STV_N−1 pulls down the STV_N to a low level through the first tristate NOT gate TN1 and the fourth NOT gate N4. Then, no matter what state the CK/CKB signal is in, the OUT_1/OUT_2 output remains to be a low level.

Thereafter, STV_N and OUT_1/OUT_2 remains at a low level. Each stage of GOA completes shift of the scanning excitation pulse and output of the current-stage driving pulse according to the above process.

It should be understood that the circuit arrangements shown in FIGS. 5 and 8 are only exemplary. For the same circuit actions or functions, different gate circuit structures may be obtained based on Boolean algebra formulas. For example, with ingoring the buffer circuit, the functions of the digital logic circuit in the GOA output module 120 as illustrated in FIGS. 5 and 8 may be represented as:

$$\text{OUT\_1} = \overline{\overline{(CKKB \cdot inxtpls)} \cdot CK} = \overline{\overline{(CKKB \cdot inxtpls)} + \overline{CK}} = \overline{CKKB + inxtplsCK}$$

$$\text{OUT\_2} = \overline{\overline{(CKKB \cdot inxtpls)} \cdot CKB} = \overline{\overline{(CKKB \cdot inxtpls)} + \overline{CKB}} = \overline{CKKB + inxtplsCKB}.$$

Specifically, each Boolean algebra expression represents a specific gate circuit structure. Thus, alternatively to the gate circuit structures as illustrated in FIGS. 5 and 8, the first gate line driving pulse OUT_1 may also be generated with a digital logic circuit constituted by a NAND gate, a NOT gate and a NOR gate, i.e., $\text{OUT\_1} = \overline{\overline{(CKKB \cdot inxtpls)} + \overline{CK}}$. Such a variant is known to a skilled person in the art, which will not be described in detail here.

According to one embodiment, the GOA circuit cells 100, 200 described above may be manufactured based on a CMOS process. In an alternative embodiment, the GOA circuit cells 100, 200 described above may be manufactured based on a NMOS process. In the latter case, the number of transistors may be further reduced, thus resulting in a further is reduce in the area occupied by GOA.

In addition, according to another aspect of the present disclosure, a display panel is also provided, comprising the GOA circuit described above. The GOA circuit may comprise a plurality of cascaded GOA circuit cells 100 or 200. The display panel may be applied to any product or component with a display function, such as a liquid crystal display, a liquid crystal television, a digital photo frame, a mobile phone, a tablet computer, etc.

Although the foregoing discussion includes a number of specific implementation details, these should not be construed as limitations to any invention or possible scope of protection, but as descriptions for the features of the specific embodiment(s) that may be confined to a specific invention. In this description, the specific features described in different embodiments may also be implemented in combination in a single embodiment. On the contrary, different features described in a single embodiment may also be implemented respectively or in any appropriate sub-combination in a plurality of embodiments. In addition, although features may be described earlier to function in a specific combination, and even be claimed initially in this way, one or more features from this claimed combination may also be excluded from the combination under some circumstances, and this claimed combination may be directed to a sub-combination or a variant thereof.

In view of the above description and in conjunction with reading of the accompanying drawings, various modifications and changes to the foregoing exemplary embodiments of the present disclosure may be to apparent to a person skilled in the art. Any and all modifications still fall within the scope of the non-restrictive and exemplary embodiments of the present disclosure. In addition, the other embodiments of the herein described present disclosure will occur to a skilled person in the art, to which these embodiments pertain, after benefiting from the teaching is provided by the foregoing description and the related accompanying drawings.

Therefore, it should be understood that the embodiments are not limited to the specific embodiments as disclosed, and it is also intended that the modifications and other embodiments be included in the scope of the appended claims. Although specific terms are used herein, they are only used in a universal and a descriptive sense, and are not for a limitation purpose.

The invention claimed is:

1. A CMOS-based gate driver on array (GOA) circuit cell, comprising:
    a first input terminal for receiving a current-stage excitation pulse;
    a second input terminal for receiving a first additional clock signal;
    a third input terminal for receiving a second additional clock signal, the second additional clock signal being an anti-phase version of the first additional clock signal;
    a fourth input terminal for receiving a first clock signal;
    a fifth input terminal for receiving a second clock signal, the second clock signal being an anti-phase version of the first clock signal;
    a first output terminal for outputting a secondary excitation pulse;
    a first current-stage output terminal for outputting a first gate line driving pulse;
    a second current-stage output terminal for outputting a second gate line driving pulse;
    a GOA registering module, having a shift register unit; and
    a GOA output module, having a digital logic circuit;
    wherein the current-stage excitation pulse, the first additional clock signal and the first clock signal are synchronized, the width of the current-stage excitation pulse is equal to one cycle of the first additional clock signal, the cycle of the first additional clock signal is two times the cycle of the first clock signal, and both the widths of the first gate line driving pulse and the second gate line driving pulse are equal to a half cycle of the first clock signal;
    wherein the current-stage excitation pulse and the first additional clock signal are provided to the shift register unit, such that the secondary excitation pulse is output at the first output terminal, the secondary excitation pulse being a delayed version of the current-stage excitation pulse which is shifted by a half cycle of the first additional clock signal;
    wherein the current-stage excitation pulse, the second additional clock signal, the first clock signal and the second clock signal are provided to the digital logic circuit, such that only during a first half pulse width of the current-stage excitation pulse, the first gate line driving pulse corresponding in timing to a first half cycle of the first clock signal is output at the first current-stage output terminal, and the second gate line driving pulse corresponding in timing to a second half cycle of the second clock signal is output at the second current-stage output terminal;
    wherein the digital logic circuit comprises:
        an AND gate, with one of its two input terminals provided with the current-stage excitation pulse, and the other input terminal provided with the second additional clock signal;
        a first NAND gate, with one of its input terminals connected to an output terminal of the AND gate, and the other input terminal provided with the first clock signal;
        a first NOT gate, with its input terminal connected to an output terminal of the first NAND gate;
        a second NAND gate, with one of its input terminals connected to an output terminal of the AND gate, and the other input terminal provided with the second clock signal; and
        a second NOT gate, with its input terminal connected to an output terminal of the second NAND gate; and
    wherein an output signal of the first NOT gate is routed to the first current-stage output terminal as the first gate line driving pulse, and an output signal of the second NOT gate is routed to the second current-stage output terminal as the second gate line driving pulse.

2. The GOA circuit cell according to claim 1, wherein the digital logic circuit further comprises:
    a first buffer circuit for buffering the first gate line driving pulse before routing it to the first current-stage output terminal for output; and
    a second buffer circuit for buffering the second gate line driving pulse before routing it to the second current-stage output terminal for output.

3. The GOA circuit cell according to claim 2, wherein the first buffer circuit comprises an even number of NOT gates interconnected in series, and the second buffer circuit comprises an even number of NOT gates interconnected in series.

4. The GOA circuit cell according to claim 1, wherein the shift register unit comprises:
    a third NOT gate, with its input terminal provided with the first additional clock signal;
    a first tristate NOT gate, with its input terminal provided with the current-stage excitation pulse, its first control terminal connected to an input terminal of the third NOT gate, and its second control terminal connected to an output terminal of the third NOT gate;
    a second tristate NOT gate, with its output terminal connected to an output terminal of the first tristate NOT gate, its first control terminal connected to an output terminal of the third NOT gate, and its second control terminal connected to an input terminal of the third NOT gate; and
    a fourth NOT gate, with its input terminal connected to an output terminal of the second tristate NOT gate, its output terminal connected to an input terminal of the second tristate NOT gate, and its output signal routed to the first output terminal as the secondary excitation pulse.

5. The GOA circuit cell according to claim 1, further comprising a scanning direction control module, wherein the scanning direction control module comprises:
    a sixth input terminal for receiving a forward-scanning excitation pulse;

a seventh input terminal for receiving a reverse-scanning excitation pulse;

a first scanning direction control terminal applied with a first DC level;

a second scanning direction control terminal applied with a second DC level, the second DC level being complementary to the first DC level;

a second output terminal connected to the first input terminal; and an analog switch, configured to selectively route one of the forward-scanning excitation pulse and the reverse-scanning excitation pulse to the second output terminal as the current-stage excitation pulse, under the control of the first DC level and the second DC level.

6. The GOA circuit cell according to claim 5, wherein the analog switch comprises a first transmission gate and a second transmission gate, wherein the forward-scanning excitation pulse is provided to an input terminal of the first transmission gate, the first DC level is applied to a first control terminal of the first transmission gate, the second DC level is applied to a second control terminal of the first transmission gate, and an output signal of the first transmission gate is routed to the second output terminal as the current-stage excitation pulse, and wherein the reverse-scanning excitation pulse is provided to an input terminal of the second transmission gate, the second DC level is applied to a first control terminal of the second transmission gate, the first DC level is applied to a second control terminal of the second transmission gate, and an output signal of the second transmission gate is routed to the second output terminal as the current-stage excitation pulse.

7. A GOA circuit, comprising at least two cascaded GOA circuit cells according to claim 1.

8. A display panel, comprising the GOA circuit according to claim 7.

9. The GOA circuit according to claim 7, wherein the digital logic circuit further comprises:

a first buffer circuit for buffering the first gate line driving pulse before routing it to the first current-stage output terminal for output; and a second buffer circuit for buffering the second gate line driving pulse before routing it to the second current-stage output terminal for output.

10. The GOA circuit according to claim 9, wherein the first buffer circuit comprises an even number of NOT gates interconnected in series, and the second buffer circuit comprises an even number of NOT gates interconnected in series.

11. The GOA circuit according to claim 7, wherein the shift register unit comprises:

a third NOT gate, with its input terminal provided with the first additional clock signal;

a first tristate NOT gate, with its input terminal provided with the current-stage excitation pulse, its first control terminal connected to an input terminal of the third NOT gate, and its second control terminal connected to an output terminal of the third NOT gate;

a second tristate NOT gate, with its output terminal connected to an output terminal of the first tristate NOT gate, its first control terminal connected to an output terminal of the third NOT gate, and its second control terminal connected to an input terminal of the third NOT gate; and a fourth NOT gate, with its input terminal connected to an output terminal of the second tristate NOT gate, its output terminal connected to an input terminal of the second tristate NOT gate, and its output signal routed to the first output terminal as the secondary excitation pulse.

12. The GOA circuit according to 7, wherein the GOA circuit cell further comprises a scanning direction control module, wherein the scanning direction control module comprises:

a sixth input terminal for receiving a forward-scanning excitation pulse;

a seventh input terminal for receiving a reverse-scanning excitation pulse;

a first scanning direction control terminal applied with a first DC level;

a second scanning direction control terminal applied with a second DC level, the second DC level being complementary to the first DC level;

a second output terminal connected to the first input terminal; and an analog switch, configured to selectively route one of the forward-scanning excitation pulse and the reverse-scanning excitation pulse to the second output terminal as the current-stage excitation pulse, under the control of the first DC level and the second DC level.

13. The GOA circuit according to claim 12, wherein the analog switch comprises a first transmission gate and a second transmission gate, wherein the forward-scanning excitation pulse is provided to an input terminal of the first transmission gate, the first DC level is applied to a first control terminal of the first transmission gate, the second DC level is applied to a second control terminal of the first transmission gate, and an output signal of the first transmission gate is routed to the second output terminal as the current-stage excitation pulse, and wherein the reverse-scanning excitation pulse is provided to an input terminal of the second transmission gate, the second DC level is applied to a first control terminal of the second transmission gate, the first DC level is applied to a second control terminal of the second transmission gate, and an output signal of the second transmission gate is routed to the second output terminal as the current-stage excitation pulse.

* * * * *